United States Patent
Fan et al.

(10) Patent No.: US 8,052,439 B2
(45) Date of Patent: Nov. 8, 2011

(54) ELECTRICAL CONNECTOR ASSEMBLY HAVING PICK-UP CAP

(75) Inventors: Chia-Wei Fan, Tu-Cheng (TW); Hao-Yun Ma, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 80 days.

(21) Appl. No.: 12/574,710

(22) Filed: Oct. 7, 2009

(65) Prior Publication Data

US 2010/0087073 A1    Apr. 8, 2010

(30) Foreign Application Priority Data

Oct. 7, 2008 (TW) ................................ 097217905

(51) Int. Cl.
*H01R 13/44* (2006.01)
(52) U.S. Cl. ...................................................... 439/135
(58) Field of Classification Search .................. 439/76.1, 439/135, 940, 941, 331, 330, 41, 342, 68, 439/70–73, 525–526
See application file for complete search history.

(56) References Cited

U.S. PATENT DOCUMENTS

| 7,001,197 | B2 | 2/2006 | Shirai et al. | |
|---|---|---|---|---|
| 7,121,844 | B2 * | 10/2006 | Ma | 439/73 |
| 7,390,202 | B2 * | 6/2008 | Ma et al. | 439/135 |
| 7,527,507 | B2 * | 5/2009 | Liao et al. | 439/135 |
| 2004/0097104 | A1 * | 5/2004 | Zhang | 439/41 |
| 2005/0124199 | A1 * | 6/2005 | Ma | 439/342 |

* cited by examiner

*Primary Examiner* — Edwin A. Leon
(74) *Attorney, Agent, or Firm* — Andrew C. Cheng; Wei Te Chung; Ming Chieh Chang

(57) ABSTRACT

A pick-up cap includes a main portion with a planar top surface and having a first end and a second end opposite to each other. At least two latches extend downwardly from the first and the second ends of the main portion, respectively. Each latch has a hook extending laterally from the latch, and the latch on the second end has a supporting portion extending downwardly and connecting with the hook for facilitative assembling and disassembling the pick-up cap from an insulative housing.

12 Claims, 6 Drawing Sheets

ELECTRICAL CONNECTOR ASSEMBLY HAVING PICK-UP CAP

BACKGROUND OF THE INVENTION

1. Field of the Invention

The present invention relates to an electrical connector assembly, and more particularly to an electrical connector assembly with a pick-up cap having a supporting arm protecting a latch thereof from breaking off resulted from excessive external maneuvering.)

2. Description of the Prior Art

U.S. Pat. No. 7,001,197 issued to Shirai on Feb. 21, 2006 discloses a typical electrical connector comprising an insulative housing having a plurality of contacts. The insulative housing has a top surface for receiving an electronic package. A cover is pivotally mounted on a first end of the insulative housing and pivotally rotates between an opened position and a closed position. The cover has an opening in a center area so that an electronic package passes through the opening to electrically connect to the contacts. A lever is pivotally mounted to a second end of the insulative housing. The lever has a locking portion for locking the cover in the closed position. A stiffener is positioned on a bottom surface of the insulative housing. While the electrical connector is put to use, the electronic package presses on top end of the contacts to establish electrical connection between the contacts and the electronic package. The electrical connector typically comprises a pick-up cap mounted to the cover or the insulative housing. The pick-up cap has two main functions: the first is to provide a planar top surface for being readily picked up by a vacuum nozzle of a vacuum device, and then to place the electrical connector assembly onto a printed circuit board; the second function is to use the top surface as a protecting cover for preventing dust and other contamination from coming into the insulative housing to pollute the contacts thereof.

FIG. 1 discloses a typical conventional electrical connector assembly with a pick-up cap 2'. The electrical connector assembly includes a stiffener having an opening in a center, an insulative housing disposed in the opening of the stiffener, a cover and a lever mounted to two opposite ends of the stiffener, respectively. The stiffener shown in FIG. 1 is omitted, while the cover and the lever, the structure of them are the same with above typical electrical connector. The pick-up cap 2' comprises a main portion 21' with a planar top surface, four latches 22' positioned at a first end and a second end which is opposite to the first end of the pick-up cap 2' for attaching to the insulative housing 3'. Each latch 22' comprises a spring arm 221' extending horizontally from the main portion 21' and a hook 222' extending downwardly from the spring arm 221'. The insulative housing 3' defines four recesses 31' corresponding to the hooks 222' and engaging with the hooks 222'. When removing the pick-up cap 2' off from the insulative housing 3', firstly, the first end of the pick-up cap 2' is lifted, and then the pick-up cap 2' is removed from the insulative housing 3'. In above process, the second end will easily trap into a gap between the insulative housing 3' and the stiffener, so that it is difficult to remove the latches 22' therefrom, furthermore, the latches 22' will be broken.

Therefore, it is needed to find a new electrical connector assembly having an improved pick-up cap to overcome the problems mentioned above.

SUMMARY OF THE INVENTION

Accordingly, an object of the present invention is to provide an electrical connector assembly having a pick-up cap which can protect a latch thereof from breaking, resulted from excessive deflection.

In order to achieve the object set forth, a pick-up cap comprises a main portion with a planar top surface and having a first end and a second end opposite to each other. At least two latches extend downwardly from the first and the second ends of the main portion, respectively. Each latch has a hook extending laterally from the latch, and the latch on the second end has a supporting portion extending downwardly and connecting with the hook for facilitative assembling and disassembling the pick-up cap.

In order to further achieve the object set forth, an electrical connector assembly comprises an insulative housing having an cavity in a center thereof and a plurality of recesses formed on outer walls thereof. A pick-up cap is assembled to the insulative housing and has a first end and a second end opposite to each other. The pick-up cap comprises a main portion having a planar top surface, and a plurality of latches extending from the opposite ends of the main portion and corresponding to the recesses, respectively. Each latch has a hook extending laterally for engaging with the recess of the insulative housing and a supporting portion extending downwardly from the hook, the supporting portion abutting against the outer wall of the insulative housing while disassembling the pick-up cap from the insulative housing.

DESCRIPTION OF PREFERRED EMBODIMENT

Reference will now be made to the drawings to describe the present invention in detail.

Figure 1:
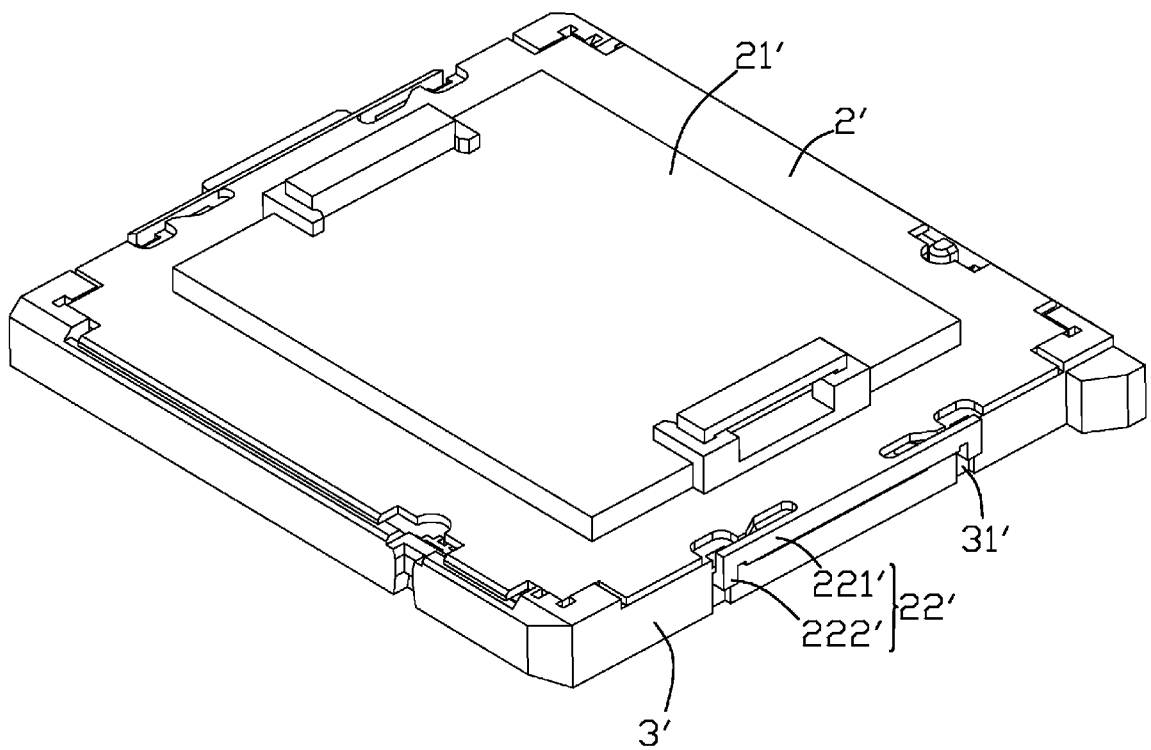
FIG. 1 is an assembled perspective view of a conventional electrical connector.
Figure 2:
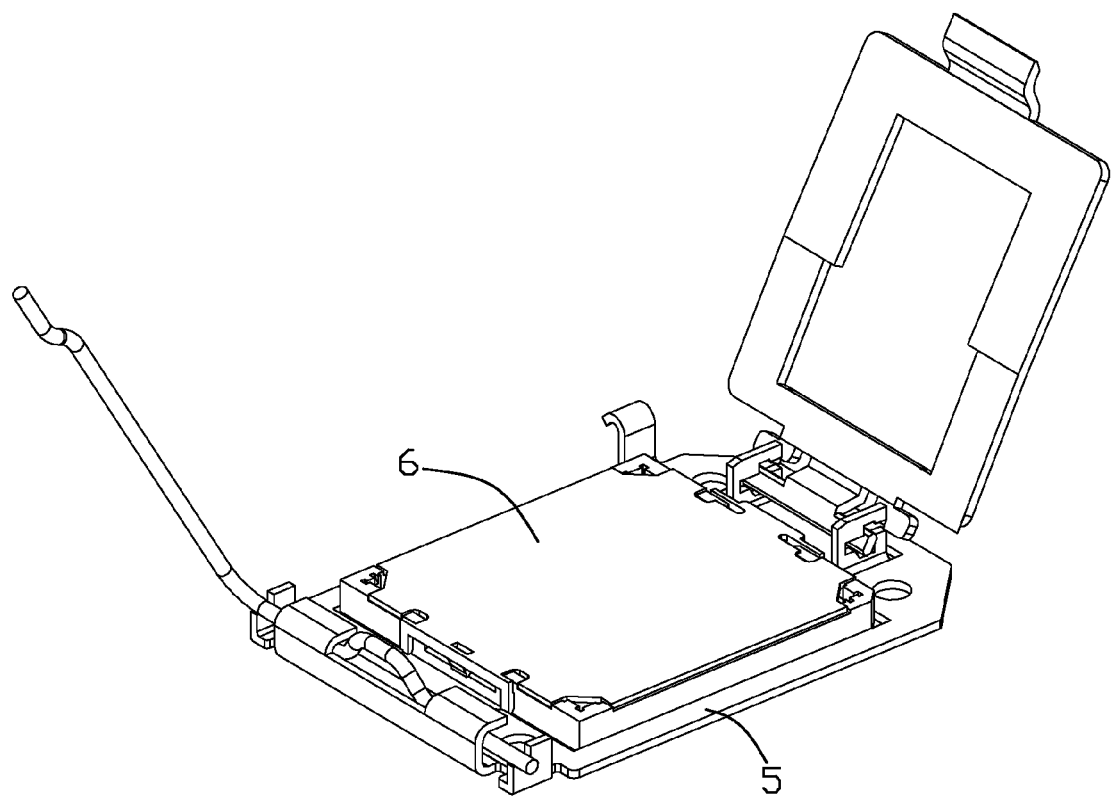
FIG. 2 is a perspective view of an electrical connector assembly according to the present invention.

FIG. 2 shows an electrical connector assembly for electrically connecting an electronic package (not shown) to a printed circuit board (not shown). The electrical connector assembly comprises an electrical connector 5 and a pick-up cap 6 assembled to the electrical connector 5.

Figure 3:
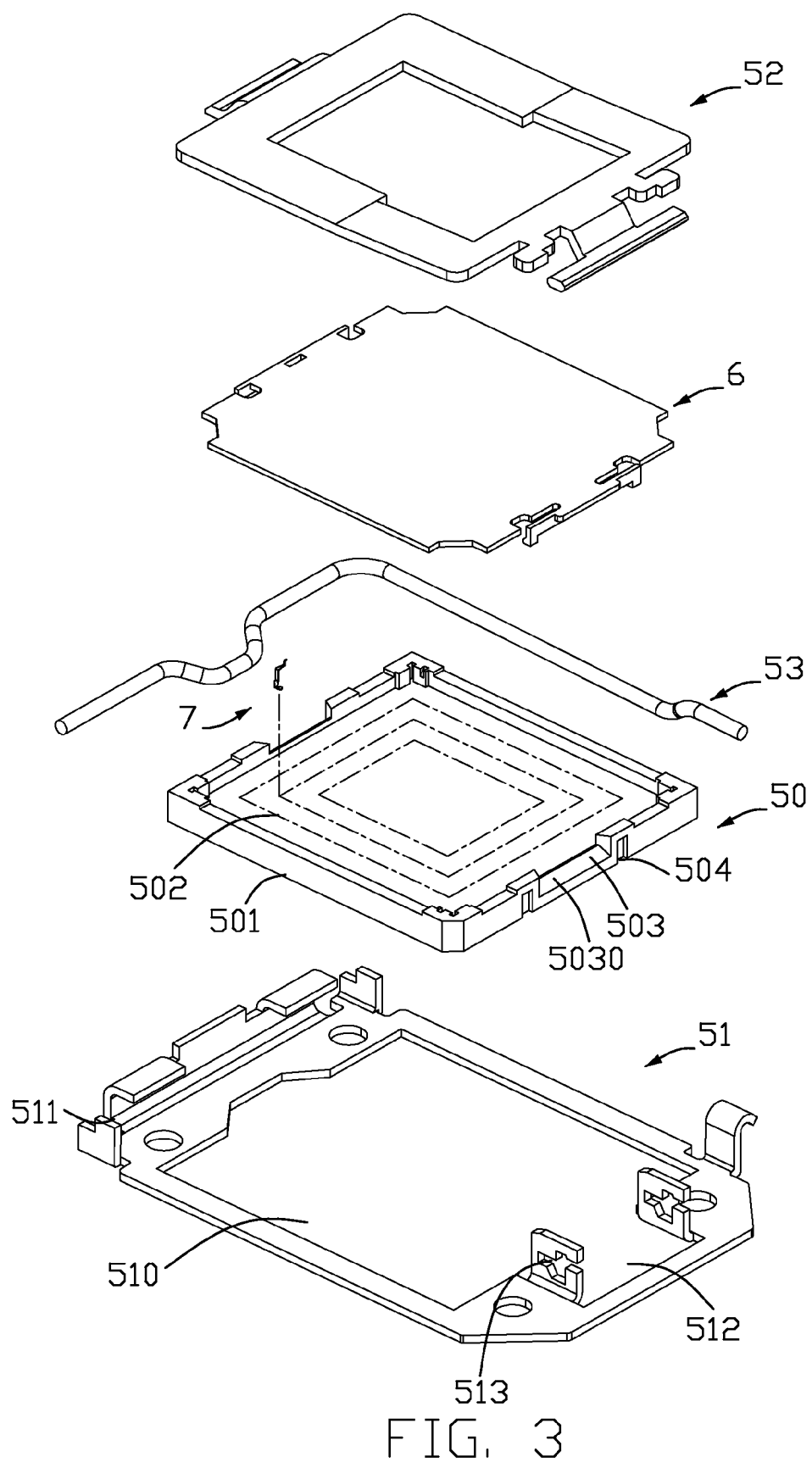
FIG. 3 is an exposed perspective view of the electrical connector of FIG. 2.

Referring to FIG. 2 and FIG. 3, the electrical connector 5 includes an insulative housing 50 with a plurality of contacts 7, a frame 51 surrounding the insulative housing 50, a load plate 52 mounted to one end of the frame 51, and a lever 53 mounted to an opposite end of the frame 51.

The insulative housing 50 is formed with a rectangular configuration and molded from resin or the like. The insulative housing 50 has a plurality of periphery walls 501 extending upwardly from an upper surface of the insulative housing 50. The upper surface and the periphery walls 501 define a cavity 502 to receive the electronic package (not shown). A plurality of passageways (not shown) communicates with the cavity 502 for receiving the contacts 7, respectively. A pair of notches 503 each with an inclined plane 5030 are defined on two opposite periphery walls 501 for transmitting heat of the electrical connector 5 in use and facilitating the electronic package (not shown) removing from the cavity 502 of the insulative housing 50. A plurality of recesses 504 are defined on the periphery wall 501 for engaging with the pick-up cap 6.

The frame 51 is formed with an opening 510 in a center thereof The insulative housing 50 is received in the opening 510 and has a gap (not labeled) between the housing 50 and the frame 51. An aperture 512 is defined on a second end of the frame 51 and communicates with the opening 510. The frame 51 has a shaft-supporting portion 513 at two opposite sides of the aperture 512 for attaching with the load plate 52, and a retaining portion 511 at a first end opposite to the second end for receiving the lever 53.

Figure 4:
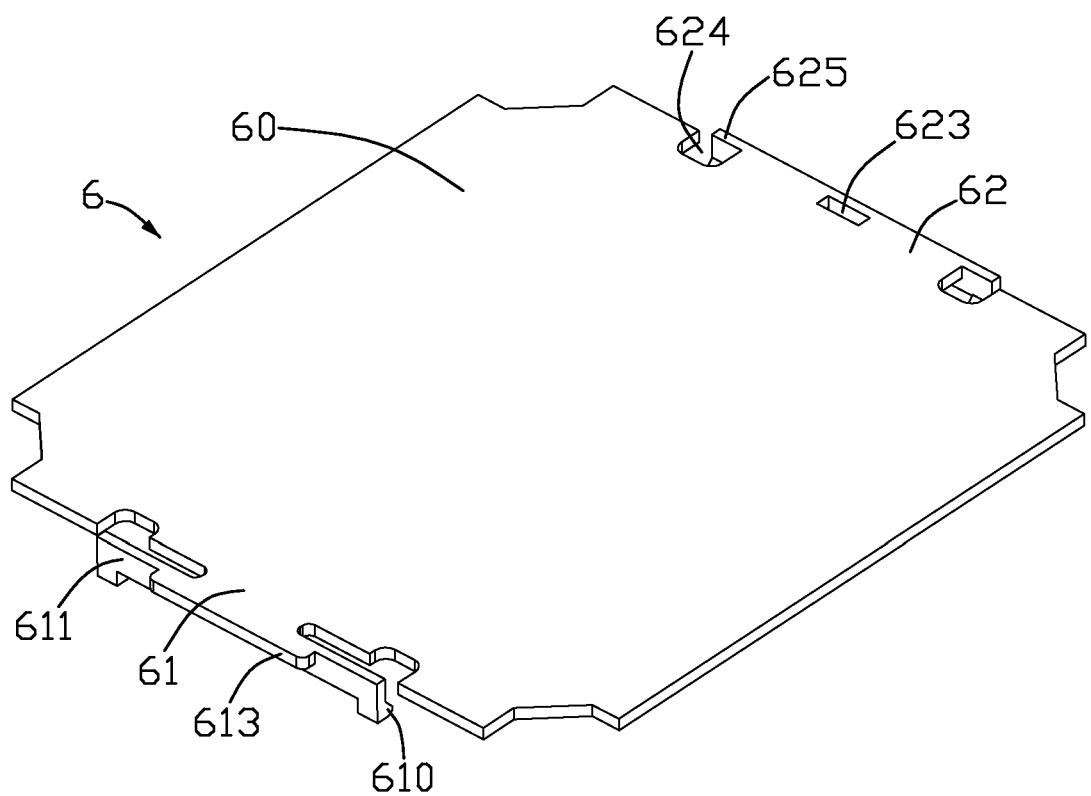
FIG. 4 is a perspective view of a pick-up cap of FIG. 2.
Figure 5:
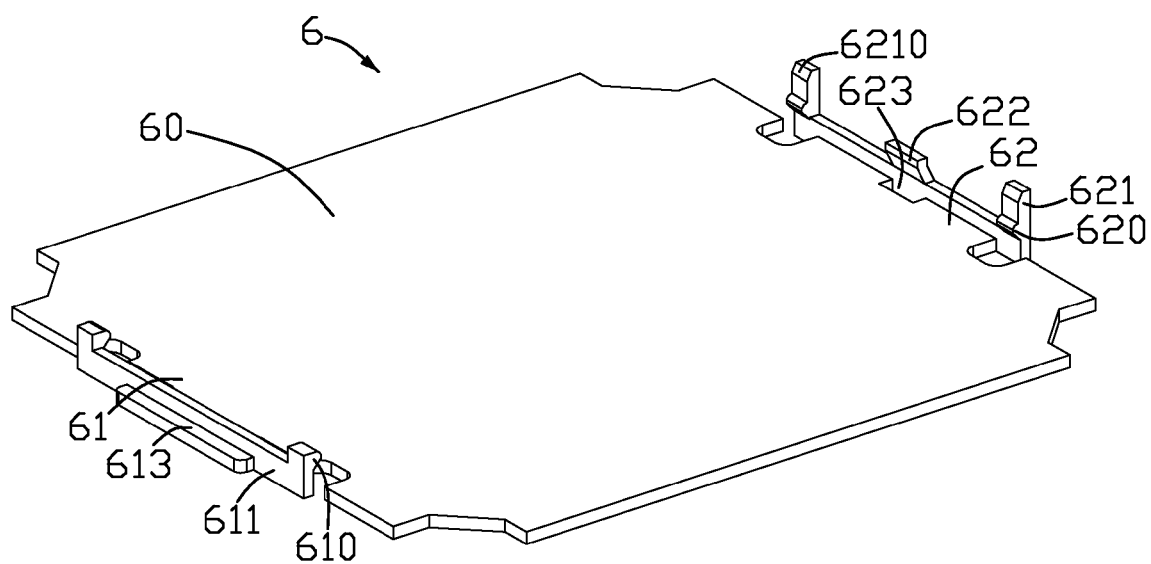
FIG. 5 is an another perspective view of the pick-up cap of FIG. 3.

Referring to FIG. 4 and FIG. 5, the pick-up cap 6 is assembled to the insulative housing 50 and is substantially rectangular. The pick-up cap 6 includes a main portion 60 with a planar top surface picked up by a vacuum nozzle (not shown) for placing the electrical connector assembly onto the printed circuit board (not shown). The pick-up cap 6 has a first end 61 and a second end 62 corresponding to the first end and the second end of the frame 51, respectively. In addition, the pick-up cap 6 further comprises at least two latches arranged on the first end 61 and the second end 62, respectively. The latches disposed on the first end 61 include a pair of first hooks 610 extending along a vertical direction and a linking portion 611 extending along a horizontal direction for connecting the main portion 60 with the pair of first hooks 610. Those two first hooks 610 are disposed at two free ends of the linking portion 611. A tongue 613 is formed on outside of the linking portion 611 for conveniently handling the pick-up cap 6 by an operator. The latch disposed on the second end 62 is asymmetrical with the first end 61. The latches disposed on the second end 62 include a pair of second hooks 620 extending downwardly and connecting with the main portion 611 by a pair of connecting portions 625. A supporting arm 621 with a lead-in surface 6210 is further extending from a free end of the second hook 620. The second pair of the hooks 620 are spaced away from each other and a curved spring arm 622 is located therebetween. A plurality of openings 623, 624 adjacent to the spring arm 622 and the second hooks 620 adapt to increase resilience of the spring arm 622 and the second hooks 620.

In assembling, the supporting arms 621 move along the outer side of the periphery wall 501 of the insulative housing 50 for favorably leading the pick-up cap 6 mounted on the insulative housing 50. After assembling, the first hooks 610 and the second hooks 620 are received in the recesses 504 thereby securing the pick-up cap 6 on the insulative housing 50, and the spring arm 622 is located corresponding to the notch 503 and the notch 503 is only partially enclosed.

Figure 6:
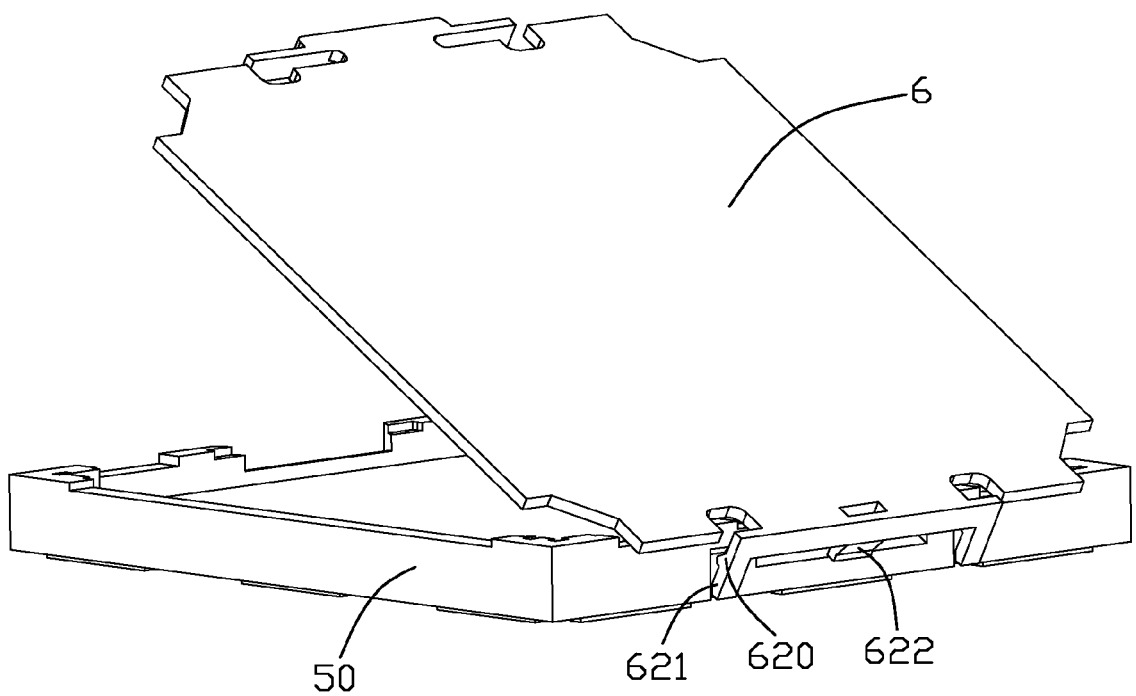
FIG. 6 is a side view, showing the pick-up cap removing from an insulative housing of the electrical connector.

Referring to FIG. 6, when the pick-up cap 6 is removed from the insulative housing 50, the tongue 613 is handled by an operator, the first end 61 is rotated relative to the second end 62, then the supporting arms 621 on the second end 62 abut against the outer wall of the insulative housing 5 and the spring arm 622 abuts against the inclined plane 5030 for provided with a resilient force to push the pick-up cap 6 away from the insulative housing 50 and avoid the second hooks 620 interference with the insulative housing 50 whereby protects the second hooks 620 from damaging.

In the present invention, the supporting arms 621 and the spring arm 622 can be disposed on the first end 61 and the second end 62, or both the first and the second ends 61, 62.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly, comprising:
   an insulative housing having a cavity in a center thereof and a plurality of recesses formed on outer walls thereof; and
   a pick-up cap assembled to the insulative housing and having a first end and a second end opposite to each other, the pick-up cap comprising a main portion having a planar top surface, and a plurality of latches extending from the opposite ends of the main portion and corresponding to the recesses, respectively, each latch having a hook extending laterally for engaging with the recess of the insulative housing and a supporting arm extending downwardly from the hook, the supporting arm abutting against the outer wall of the insulative housing while disassembling the pick-up cap from the insulative housing.

2. The electrical connector assembly as claimed in claim 1, wherein the latch disposed on the first end is asymmetrical with the latch disposed on the second end.

3. The electrical connector assembly as claimed in claim 1, further comprising a frame having an opening for receiving the insulative housing, a load plate mounted to one end of the frame, and a lever mounted to an opposite end of the frame.

4. The electrical connector assembly as claimed in claim 3, wherein the hook disposed on the first end connects with the main portion by a linking portion, and the hook disposed on the second end extends from the main portion directly.

5. The electrical connector assembly as claimed in claim 1, wherein the supporting arm has a lead-in surface for facilitative assembling the pick-up cap to the insulative housing.

6. The electrical connector assembly as claimed in claim 5, wherein a pair of notches each with an inclined plane are defined on two of the outer walls of the insulative housing for transmitting heat of the electrical connector.

7. The electrical connector assembly as claimed in claim 6, wherein the second end has a spring arm extending curved downwardly so as to abut against the inclined plane when disassembling the pick-up cap from the insulative housing.

8. The electrical connector assembly as claimed in claim 1, wherein the first end is rotated relative to the second end during disengaging the pick-up cap from the insulative housing.

9. An electrical connector assembly, comprising:
   an insulative housing having a cavity in a center thereof and a plurality of recesses formed on outer walls thereof; and
   a pick-up cap assembled to the insulative housing and having a rotating end and a handling end, the rotating end being provided with a vertically extending latch engaged with the outer wall of the housing and a spring arm located beside the outer wall, such that when the pick up cap is pivotally removed from the housing, the spring arm abuts against the outer wall prior to the interference between the latch and the recess, thereby facilitating removing of the pick-up cap from the housing.

10. The electrical connector assembly as claimed in claim 9, wherein the latch comprises a hook and a supporting arm extending downwardly below the hook, the free end of the supporting arm serving as a pivot and abutting against the outer wall so as to allow the hook to be away from the recess instead of interfering with the recess.

11. An electrical connector assembly comprising:
   an insulative housing including a plurality of side walls commonly defining a receiving cavity therein;

two pairs of cutouts formed in outer faces of opposite first and second side walls;
a plurality of contacts disposed in the housing; and
a pick-up cap mounted upon the housing and defining opposite first and second ends, a pair of deflectable hooks located at the first end respectively received in the corresponding cutouts in the first side wall, a pair of stationary latches located at the second end and respectively received n the corresponding cutouts in the second side wall; wherein the pick-up cap further includes a spring arm between the pair of stationary latches so as to form a fulcrum abutting against the second side wall during pivotally disassembling the pick-up cap from the housing.

12. The electrical connector assembly as claimed in claim 11, wherein said pick-up cap defines an opening at the second end so as to form said spring arm.

* * * * *